United States Patent [19]
Cameron et al.

[11] Patent Number: 5,949,640
[45] Date of Patent: Sep. 7, 1999

[54] POWER INVERTER WITH RE-ORIENTABLE DISPLAY PANEL AND AC PORT MODULES

[75] Inventors: Robert Fraser Cameron, Vancouver; Samson Chun-Tat Wong, Coquitlam, both of Canada

[73] Assignee: Statpower Technologies Corp., Canada

[21] Appl. No.: 08/914,716

[22] Filed: Aug. 19, 1997

[51] Int. Cl.[6] .................................................. H02B 1/00
[52] U.S. Cl. ..................... 361/600; 361/622; 361/679; 361/730; 361/823; 361/807
[58] Field of Search .............................. 307/150; 361/600, 361/622, 625, 679, 695, 728–733, 735, 744, 807, 809, 823

[56] References Cited

U.S. PATENT DOCUMENTS

| | | | |
|---|---|---|---|
| 3,717,805 | 2/1973 | Gnaedinger et al. | 307/150 |
| 4,471,898 | 9/1984 | Parker | 361/730 |
| 4,872,102 | 10/1989 | Getter | 363/141 |
| 4,964,018 | 10/1990 | Mallory et al. | 361/625 |
| 5,170,336 | 12/1992 | Getter et al. | 361/695 |
| 5,293,145 | 3/1994 | Rynkiewicz | 336/65 |
| 5,600,550 | 2/1997 | Cook, II | 363/58 |
| 5,742,478 | 4/1998 | Wu | 361/730 |

OTHER PUBLICATIONS

Product Brochure—Statpower Technologies Corporation. PROwatt line of power inverters. Copyright ©1996. Printed in Canada.
Product Brochure—Statpower Technologies Corporation. PORTAWATTZ line of power inverters. Copyright ©1996. Printed in Canada.
Product Brochure—Statpower Technologies Corporation. PROsine line of power inverters. Copyright ©1995. Printed in Canada.
Product Brochure—Statpower Technologies Corporation. PROsine Inverter Chargers Copyright ©1997. Printed in Canada.

*Primary Examiner*—Gregory Thompson
*Attorney, Agent, or Firm*—Fulbright & Jaworski L.L.P.

[57] ABSTRACT

A DC to AC power inverter having a housing with an AC power port for receiving an AC power module and a control port for receiving a control panel module.

12 Claims, 4 Drawing Sheets

POWER INVERTER WITH RE-ORIENTABLE DISPLAY PANEL AND AC PORT MODULES

BACKGROUND OF THE INVENTION

The present invention relates to DC to AC power inverters and more specifically to an inverter which may be mounted in a number of different mounting orientations having a control panel with a display panel module thereon that can be re-oriented to suit a particular mounting of the inverter.

Power inverters which convert DC to AC are used in a wide variety of mobile and fixed locations, including boats, recreational vehicles, trucks, automobiles, construction sites, factories, remote homes and cabins. Commonly, such inverters provide single phase AC power (120VAC or 230VAC) from a 12V or 24V battery commonly found in vehicles and boats.

Because of the wide range of locations and applications where inverters are used, inverter installation needs differ significantly. In addition, electrical wiring standards and regulatory codes of different industries and jurisdictions influence the preferred mode of installation. One of the problems that exists in inverters available today is that they do not provide end users with sufficient flexibility to install the inverter in different mounting orientations or to provide different AC power connections to suit these different jurisdictions.

Inverters are generally designed for two installation options. The first installation option is a hard wired installation when the inverter is permanently wired to an AC electrical wiring system in the host vehicle or building. In this installation the inverter may be mounted in a location which is accessible only by service personnel. User controls and displays are either non-existent or are on a separate control panel that is remote from the inverter, an d installed in a user-accessible location. The display panel is connected by cable to the inverter. The second installation option is a stand alone option. In this approach standard plugs on AC cables are plugged into a standard AC receptacle on the inverter as required. The inverter is installed in a location which is easily accessible to the user. Such installation is one that generally allows easy removal of the inverter so it can be used in another location. In this type of installation all the user controls and displays are generally mounted on the inverter itself.

Existing power inverters are generally designed for either hard wiring or stand alone, but they do not generally offer an adequate solution for both options. Some inverters designed primarily for stand alone applications offer terminals for hard wire connection, however, in many cases the terminal spacings and wiring compartments do not meet the requirements of regulatory agencies. Some inverters designed primarily for hard wire applications offer an AC convenience receptacle, however, they do not offer the small size, multiple mounting orientations, on board control and display functions that are required for a true stand alone inverter.

SUMMARY OF THE INVENTION

In accordance with one aspect of the invention, there is provided a DC to AC power inverter having a housing with an AC power port for receiving an AC power module and a control port for receiving a control panel module.

Preferably, the apparatus includes a control panel module mountable in different mounting orientations in the control port.

Preferably, the inverter has a plug extending from within the control port and preferably, the control panel has a receptacle for receiving the plug.

Preferably, a receptacle jack is provided in the control port for connection to a cable joined to the control panel module positioned remotely from the inverter.

Preferably, the control panel includes a display indicating power conversion parameters for the inverter.

Preferably, the apparatus includes an AC power module mounted in the power port, the AC power module having a terminal block for receiving connecting wires and transfer relay for connecting the connecting wires in electrical contact with the inverter.

Preferably, the AC power module includes an access panel for covering the terminal block.

Preferably, the AC power module has a standard, single phase AC receptacle which accepts standard AC appliance plugs.

Preferably, the receptacle includes a North American single phase 120-Volt AC receptacle.

Preferably, the receptacle includes a European receptacle.

Preferably, the AC power module has a European receptacle for 230 Volts.

BRIEF DESCRIPTION OF THE SEVERAL VIEWS OF THE DRAWING

In drawings which illustrate embodiments of the invention.

DETAILED DESCRIPTION OF THE INVENTION

Figure 1:
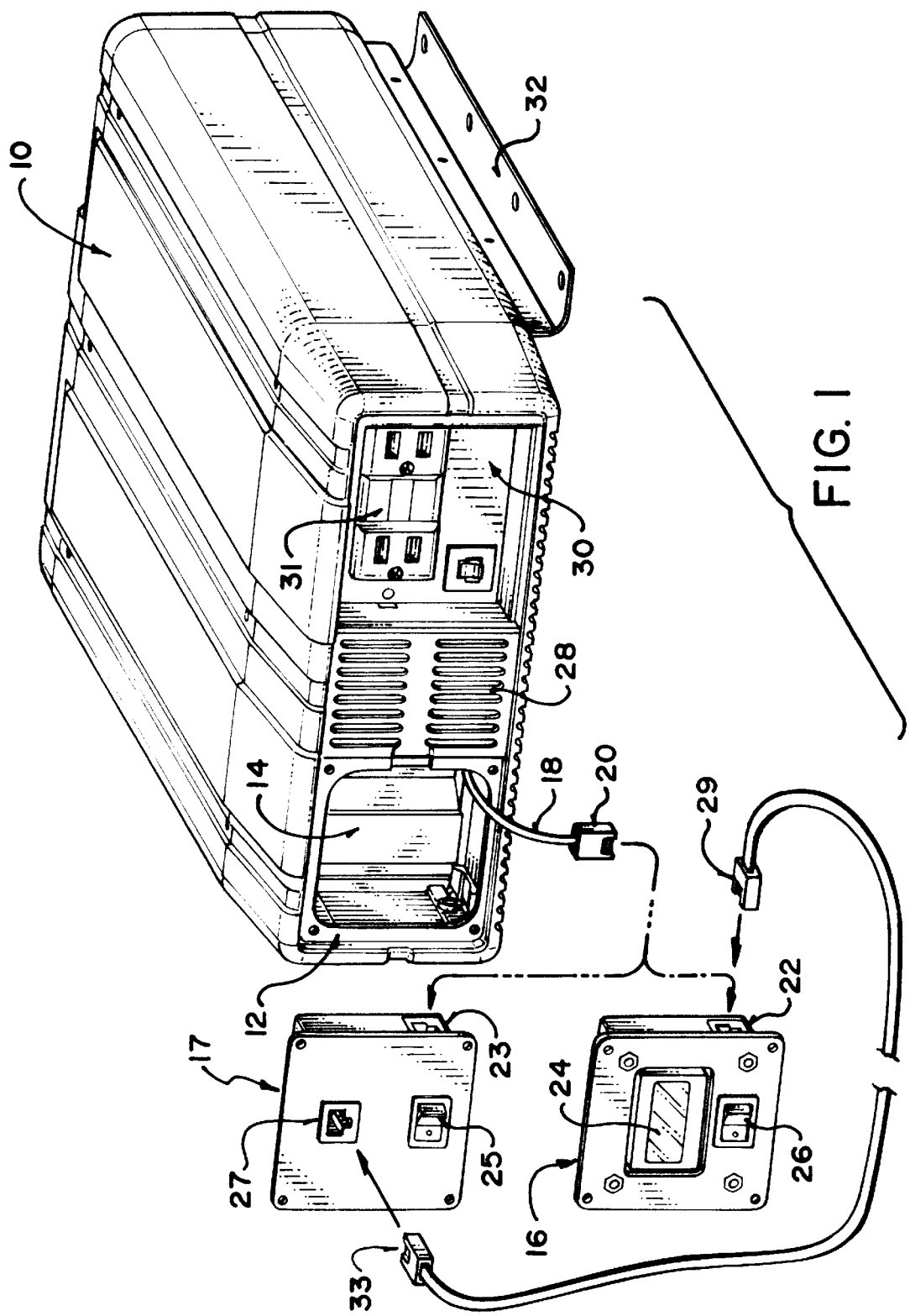
FIG. 1 is an isometric view showing a DC to AC power inverter with a remote control panel module for mounting in different orientations in a control panel according to one embodiment of the invention.

Referring now to FIGS. 1 to 4, there is shown a DC to AC power inverter 10 which has a front panel 12 with a generally square shaped open control port 14 on the lefthand side for a control panel 16 or a remote interface module 17. In the center of the inverter 10 is a grill 28 for cooling purposes and on the righthand side of the inverter 10 is an AC power port 30 which is suitable for inserting replaceable AC power modules.

Mounting Brackets

Figure 2:
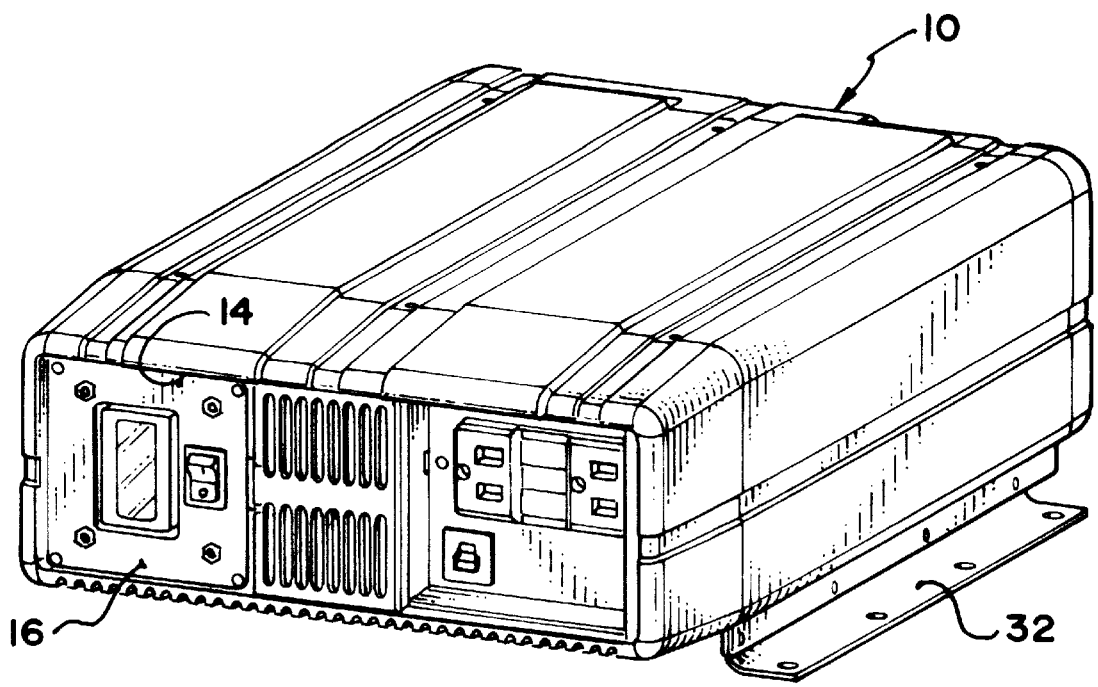
FIG. 2 is an isometric view of the power inverter shown in FIG. 1 wherein the control panel module is mounted for sideways orientation.
Figure 3:
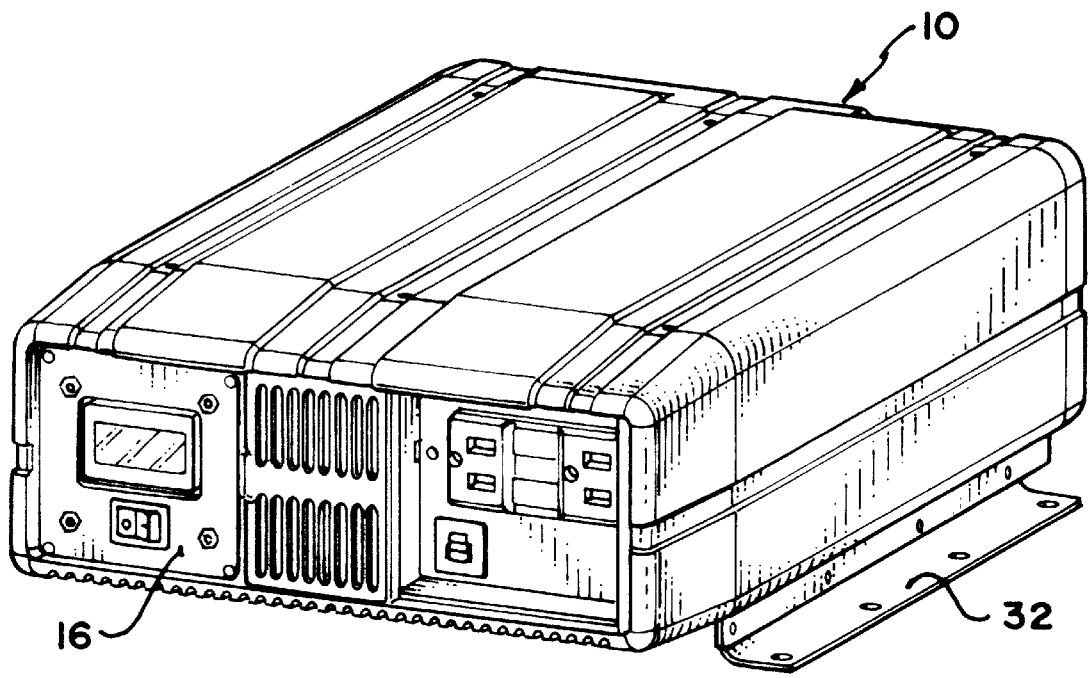
FIG. 3 is an isometric view showing the inverter of FIG. 1 wherein the control panel module is mounted for upright orientation.

The inverter 10 has a mounting bracket 32 fixed thereto so that the inverter 10 can be mounted in different orientations. FIG. 2 shows the inverter 10 with the control panel 16 oriented for sideways mounting of the inverter such as would be employed if the inverter were mounted on a wall. FIG. 3 shows the inverter 10 with the control panel 16 oriented for an upright or horizontal mounting such as would be employed if the inverter were installed on a floor or other horizontal surface where the horizontal surface is beneath the inverter. In another embodiment, (not shown) the inverter 10 may be mounted upside down with the brackets 32 on top. This orientation would be used if the inverter were mounted to a ceiling or under a shelf, for example.

Control Port

The control port 14 and control panel 16 are approximately square and therefore, the control panel 16 can be mounted in the control port in any orientation such that the control panel is in an orientation readily readable by an operator, regardless of the mounted orientation of the inverter. The control port 14 has a connecting cable 18 extending from within the control port, the cable having a plug 20 to fit into a receptacle 22 at the base of the control panel 16 to facilitate different mounting orientations of the control panel 16 in the control port 14. The connecting cable 18 is just long enough to allow the operator to remove the control panel 16 from the control port 14 to separate the plug 20 from the receptacle 22. When the control panel 14 is installed in the control port, the cable 18 is stored within the control port 14, behind the control panel 16.

The control panel 16 has a meter 24 for indicating power conversion parameters associated with the inverter, such as voltage, current and power, and has a switch 26 for powering the invention on and off.

AC Power Port

Figure 5:
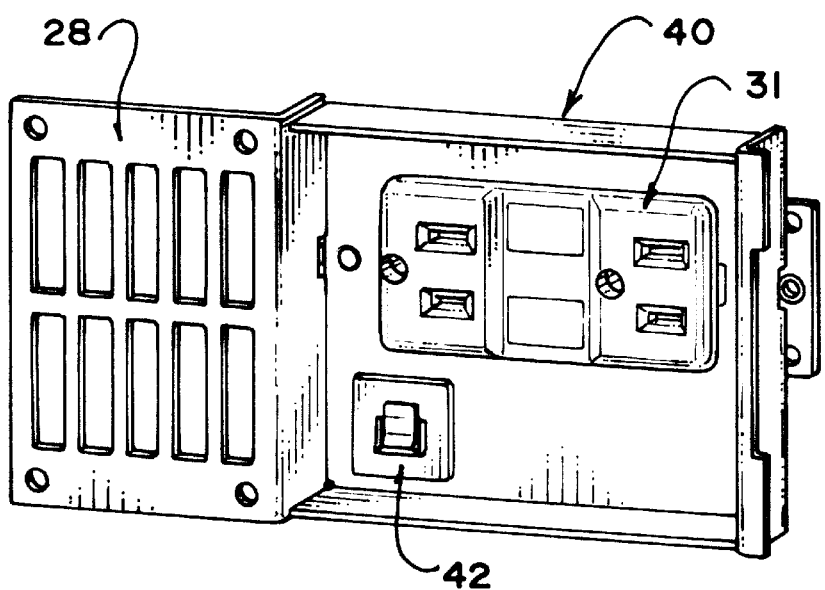
FIG. 5 is an isometric view showing a replaceable module for the AC power port with a North American receptacle therein according to one embodiment of the invention.

The AC power port 30 is similar to the control port 14 in that it is operable to a receive and hold different AC power modules. FIG. 5 illustrates a North American AC module 40 installed in the AC power port 30. The North American AC module includes a receptacle 31 for receiving a conventional North American AC power plug for supplying power to a conventional North American AC appliance. A circuit breaker 42 is provided under the receptacle 31. The module 40 is attached by screws into the power port 30.

Figure 6:
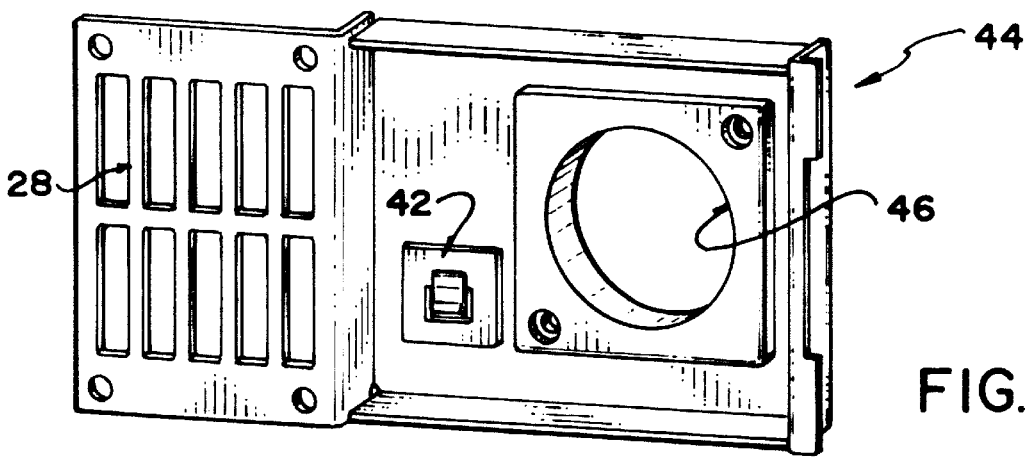
FIG. 6 is an isometric view showing a replaceable module for an AC power port with a European receptacle therein.

FIG. 6 illustrates a European receptacle module 44 with a European receptacle 46 and circuit breaker 42. The module 44 fits into the AC power port 30, replacing the North American module 40. Whereas two replaceable modules are illustrated, it will be apparent that other modules may be supplied which have standard electrical receptacles for other countries. In nearly all cases the AC power outlet supplies either single phase 120VAC or 230VAC.

Figure 4:
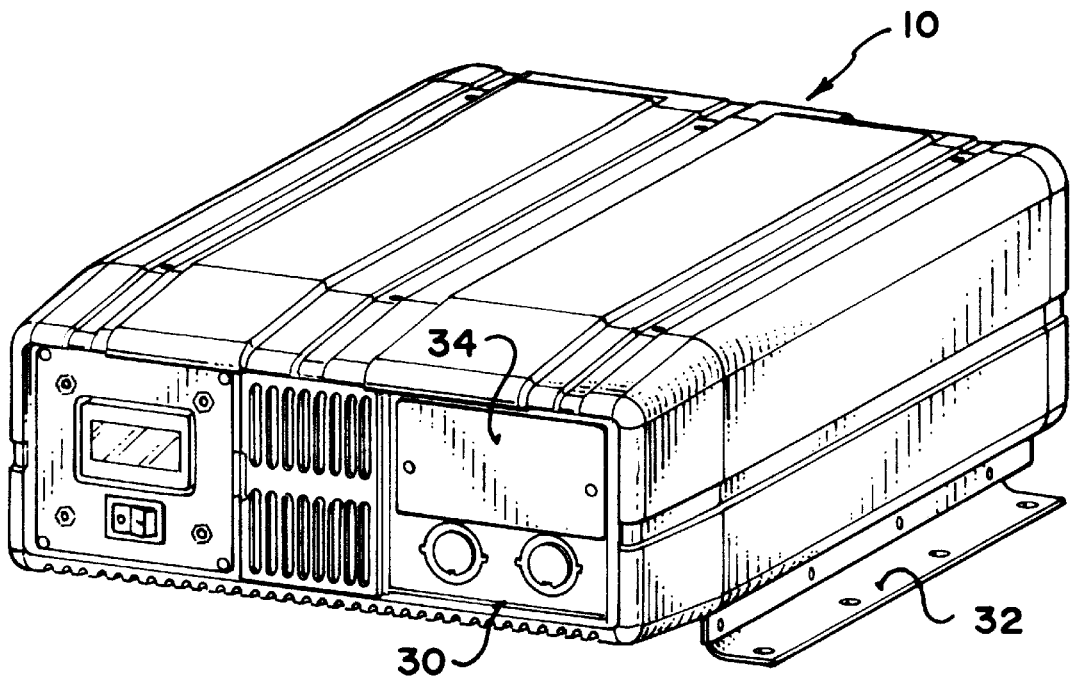
FIG. 4 is an isometric view showing the inverter of FIG. 1 wherein the AC power port has a module for AC cable connection.
Figure 7:
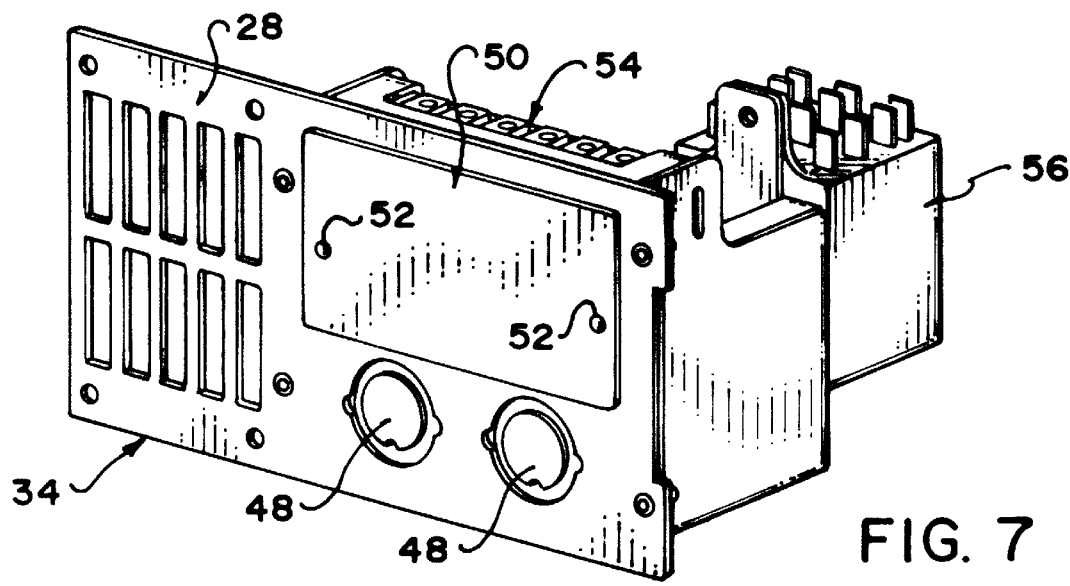
FIG. 7 is an isometric view showing a replaceable module for an AC power port with AC cable connections for hard wiring.
Figure 8:
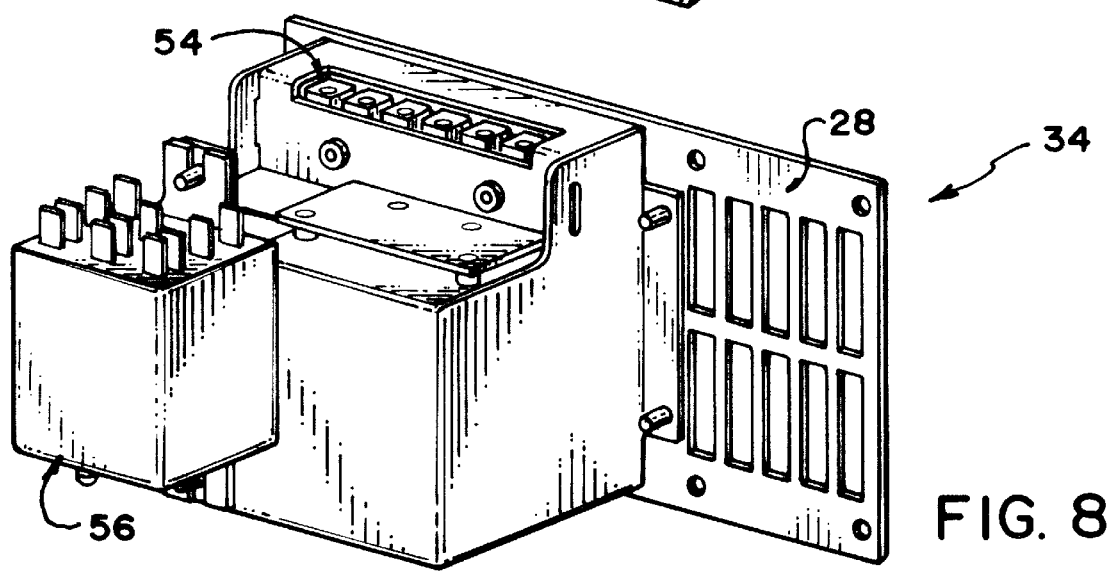
FIG. 8 is an isometric view showing the back of the replaceable module of FIG. 7.

FIGS. 4, 7 and 8 show a hard wire connection module 34 for the AC power port 30. Referring to FIG. 7 and 8, the hard wire connection module 34 shows knockouts 48 for AC cables and above the knockouts 48 an access panel 50 attached by screws 52 which provides access to a wiring compartment to permit AC cables to be connected to the terminal block 54 as shown more clearly in FIG. 8. An AC transfer relay 56 is shown attached to the back of the module for connection within the inverter 10.

Alternatives

Referring to FIG. 1, in an alternative embodiment, a remote interface module 17 having a receptacle 23 a switch 25 and an extension receptacle 27 is shown. The remote interface module 17 has a square shape matching that of the control port 14 and thus is operable to be mounted in the control port 14 in any orientation. The receptacle 23 is operable to receive the plug 20 and the receptacle is in communication with the extension receptacle 27. A filter, not shown, is installed in electrical communication with wires connecting the receptacle 23 to the extension receptacle 27.

An extension cable having a first and second extension plugs 29 and 33 is used to connected the control panel module 16 installed in a location remotely of the inverter, to the inverter through the remote interface module 17. The first and second plugs 29 and 33 are received in the receptacle 22 and the extension receptacle 27 respectively to establish communication between the control panel and the inverter.

Generally, the inverter has a control port and a power port which may receive a control module and a power module respectively, the modules being adapted to suit a particular user's need with respect to mounting orientation of the control panel, location of the control panel and AC electrical requirements.

While specific embodiments of the invention have been described and illustrated, such embodiments should be considered illustrative of the invention only and not as limiting the invention as construed in accordance with the accompanying claims.

What is claimed is:

1. A DC to AC power inverter having a housing with an AC power port for receiving an AC power module and a control port for receiving a control panel module, and further including a control panel module mountable in different mounting orientations in the control port.

2. The power inverter according to claim 1 wherein the inverter has a plug extending from within said control port and wherein said control panel module has a receptacle for receiving said plug.

3. The power inverter according to claim 1 wherein a receptacle is provided in the control port for connection to a cable joined to the control panel module to permit said control panel module to be positioned remotely from the inverter.

4. The power inverter according to claim 1 wherein the control panel module includes a display indicating power conversion parameters for the inverter.

5. The power inverter according to claim 1 further including an AC power module mounted in said power port, said AC power module having a terminal block for receiving connecting wires and a transfer relay for connecting said connecting wires in electrical contact with said inverter.

6. The power inverter according to claim 5 wherein the AC power module includes an access panel for covering said terminal block.

7. The power inverter according to claim 1 further including an AC power module receivable in the AC power port having a standard, single phase AC receptacle which accepts standard AC appliance plugs.

8. The power inverter according to claim 7 wherein said receptacle includes a North American single phase AC receptacle.

9. The power inverter according to claim 7 wherein said receptacle includes a European receptacle.

10. The power inverter according to claim 7 wherein the AC power module has a European receptacle for 230V.

11. A DC to AC power inverter having a housing with an AC power port for receiving an AC power module and a control port for receiving a control panel module, and further including an AC power module mounted in said power port, said AC power module having a terminal block for receiving connecting wires and a transfer relay for connecting said connecting wires in electrical contact with said inverter.

12. The power inverter according to claim 11 wherein the AC power module includes an access panel for covering said terminal block.

\* \* \* \* \*